(12) United States Patent
Jen et al.

(10) Patent No.: US 6,337,173 B2
(45) Date of Patent: *Jan. 8, 2002

(54) METHOD FOR FABRICATING A SEMICONDUCTOR CAPACITOR

(75) Inventors: Tean-Sen Jen, Chiayih; Shiou-Yu Wang, Taipei; Jia-Shyong Cheng, Hsinchu Hsien, all of (TW)

(73) Assignee: Nanya Technology Corporation, Taoyuan (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/208,452

(22) Filed: Dec. 10, 1998

(51) Int. Cl.[7] .............................. G03F 7/26; G03H 1/00
(52) U.S. Cl. .......................... 430/313; 430/1; 430/311; 430/319; 430/394
(58) Field of Search ..................... 430/1, 311, 313, 430/319, 394

(56) References Cited

U.S. PATENT DOCUMENTS

| | | | | |
|---|---|---|---|---|
| 4,049,944 A | * | 9/1977 | Garvin | 219/121 |
| 4,496,216 A | * | 1/1985 | Cowan | 350/162.17 |
| 5,295,004 A | * | 3/1994 | Hasegawa | 359/17 |
| 5,415,835 A | * | 5/1995 | Bruek | 430/311 |
| 5,759,744 A | * | 6/1998 | Bruek | 430/312 |
| 5,841,143 A | * | 11/1998 | Tuma | 250/458.1 |
| 5,989,952 A | * | 11/1999 | Jen | 438/253 |
| 6,042,998 A | * | 3/2000 | Brueck | 430/316 |

* cited by examiner

Primary Examiner—Mark F. Huff
Assistant Examiner—Nicole Barreca
(74) Attorney, Agent, or Firm—Michael D. Bednarek; Shaw Pittman LLP

(57) ABSTRACT

A method for fabricating a capacitor electrode on a semiconductor substrate includes the steps of: forming a conducting layer over the semiconductor substrate; forming a photoresist layer over the conducting layer; patterning the photoresist layer through an interfering exposure step; and patterning the conducting layer using the patterned photoresist layer as a mask, thereby forming a capacitor electrode.

13 Claims, 11 Drawing Sheets

METHOD FOR FABRICATING A SEMICONDUCTOR CAPACITOR

BACKGROUND OF THE INVENTION

1. Field of the Invention

The invention relates to a method for fabricating a semiconductor capacitor, and more specifically to a method for fabricating the capacitor of a stacked dynamic random access memory (DRAM).

2. Description of Related Art

As a basic element of the semiconductor integrated circuit, the capacitor cannot be replaced by other devices. For most of the widely used electronic components, such as DRAM, oscillators, time delay circuitry, and AD/DA converters, a capacitor is definitely required. The capacitor thus holds an important position in semiconductor circuit design.

The fundamental structure of a capacitor includes a dielectric material which isolates two conducting parts, known as electrodes. The capacitance is therefore determined by three physical characteristics of the capacitor structure: thickness of the dielectric material, the surface area of the electrodes, and electronic and mechanical properties of the dielectric material as well as the electrodes.

In a DRAM cell, the substrate area must be minimized or the cell density cannot be increased. The capacitor in the DRAM cell, however, has to increase the electrode area for a high capacitance. A three-dimensional stacked capacitor cell has therefore been developed to satisfy the requirement of a high-density DRAM circuit. The stacked capacitor has a bristle structure over the access device of a DRAM cell, thus having a low soft error rate (SER) and high dielectric constant.

However, the fabrication process of the three-dimensional stacked capacitor is complicated and costly. The method for fabricating a bristle stacked capacitor, as disclosed in Taiwan Patent No. 239234, will be described in accompaniment with FIG. 1A through FIG. 1D.

Referring to FIG. 1A, a silicon substrate 20 is provided. As known to those skilled in the art, a field oxide layer and a transistor including source/drain diffusion regions should be formed on the silicon substrate 20, but they are omitted in the figure for simplicity. The method for fabricating a capacitor includes depositing an oxide layer 23 by chemical vapor deposition (CVD) over the silicon substrate 20. The oxide layer 23 is etched to form a contact window. A polysilicon layer 24 is then formed by the CVD method over the oxide layer 23 and contacts the silicon substrate 20 via the contact window. Another oxide layer 31 and polysilicon layer 32 are then successively formed over the polysilicon layer 24. Moreover, an aluminum layer 33 is formed over the polysilicon layer 32. The aluminum layer 33 and the polysilicon layer 32 are then annealed at a temperature of 400° C.–577° C. for 10–1000 seconds, thus forming a plurality of silicon grains between polysilicon layer 32 and oxide layer 31.

Referring to FIG. 1B, using the oxide layer 31 as an etch stop, the structure of FIG. 1A is etched by aqua regia ($HNO_3:HCl=1:3$). Silicon grains 32a having a dimension of 500–5000 Å therefore remain over the oxide layer 31.

Referring to FIG. 1C, the silicon grains 32a are utilized as a mask for etching the oxide layer 31 by the reactive ion etching (RIE) method, thus forming a plurality of oxide islands 31a having a dimension of 500–5000 Å. Moreover, the oxide islands 31a are utilized as a mask for etching the polysilicon layer 24 to a predetermined thickness, thereby forming a plurality of irregular polysilicon pillars.

Referring to FIG. 1D, as the silicon grains 32a and the oxide islands 31a are removed, the polysilicon layer 24 is the lower electrode of a capacitor. The electrode area has therefore been increased by the polysilicon pillars.

The fabricating method described above, however, has very complicated steps and cannot be precisely controlled. For example, the dimensions of the silicon grains 32a produced by annealing are not easily controlled.

SUMMARY OF THE INVENTION

Accordingly, the invention provides a method for fabricating a semiconductor capacitor of high capacitance. The steps of the method are easily controlled.

The method of the invention fabricates a capacitor electrode on a semiconductor substrate. The method includes the steps of: forming a conducting layer over the semiconductor substrate; forming a photoresist layer over the conducting layer; patterning the photoresist layer through an interfering exposure step; and patterning the conducting layer using the patterned photoresist layer as a mask, thereby forming a capacitor electrode.

The method of the invention further includes forming a dielectric layer and an upper electrode, thereby forming a capacitor of a DRAM cell.

DETAILED DESCRIPTION OF THE INVENTION

Figure 8:
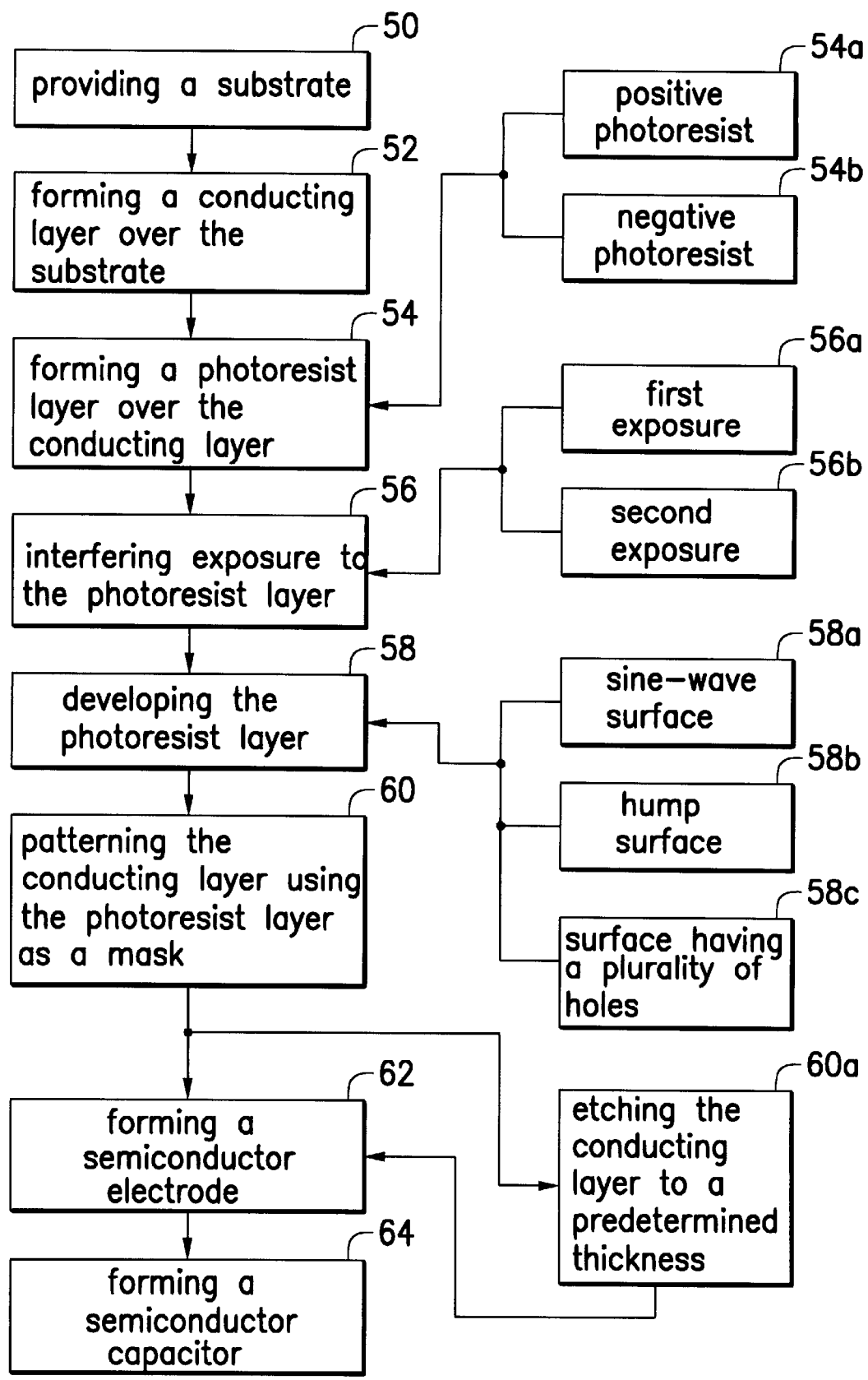
FIG. 8 is a schematic diagram illustrating the process flow of the invention.

Referring to FIG. 8, in the first step of the invention, step 50, a substrate is provided. In a following step 52, a conducting layer is formed over the substrate. Step 54 shows that a photoresist layer is formed over the conducting layer. The photoresist layer can be a positive photoresist layer (step 54a) or a negative photoresist layer (step 54b). The photoresist layer is then processed by an interfering exposure in step 56. The step 56 can be a single exposure step (step 56a) or a double exposure step (step 56b). The photoresist layer is therefore patterned to have a sine-wave shape (step 58a), a hump shape (step 58b), or a plurality of holes (step 58c).

In step 60, the conducting layer is patterned using the patterned photoresist layer as a mask, thereby having a rough surface. The invention further includes an optional step 60a in which the conducting layer is etched to a predetermined thickness. Final steps 62 and 64 include forming another electrode and finishing the capacitor.

In the invention, the sine-wave shape can be formed by interfering two light beams in a single exposure step. The hump shape and the plurality of holes can be formed by either interfering four light beams in a single exposure step or by a double exposure step which includes a first exposure step of interfering two beams and a second exposure step of interfering two beams after rotating the substrate to about an angle of 90°.

Figures 6A, 6B:
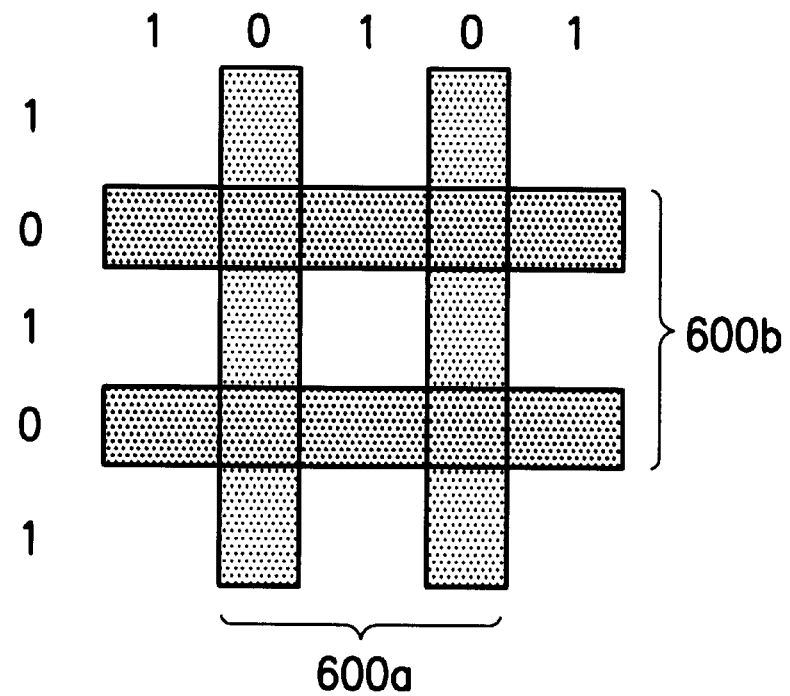
FIG. 6A is a schematic diagram illustrating the interfering pattern of four light beams.
FIG. 6B illustrates the light intensity distribution of the interfering pattern of FIG. 6A.

Moreover, the photoresist layer of the invention can be either positive or negative photoresist material. Referring to FIGS. 6A and 6B, regions 1 (white region), regions 1/2 and regions 0 (gray region) represent exposed regions, lightly exposed regions and unexposed regions, respectively. Since a positive photoresist develops its exposed regions, the photoresist layer can be patterned by over-exposing regions 1 and 1/2, thereby forming the hump shape in each region 0. Similarly, a negative photoresist layer can be patterned by under-exposing regions 0 and 1/2, thereby forming the hump shape in each region 1.

On the contrary, if a positive photoresist layer is patterned by under-exposing, only regions 1 can be exposed. A plurality of holes are therefore formed. For a negative photoresist layer, a plurality of holes can be formed by over-exposing regions 0.

The embodiments of invention will be described as follows.

As illustrated in FIGS. 2a through 2E, a first embodiment of the invention includes interfering two light beams in a single exposure step, thereby forming a sine-wave pattern.

Figure 1A:
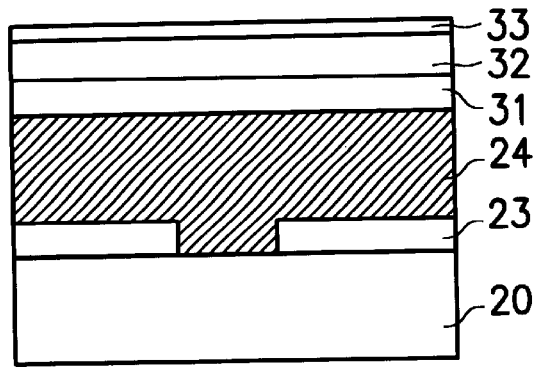
FIGS. 1A through 1D are schematic diagrams illustrating the steps of a conventional method for fabricating a stacked capacitor electrode.
Figure 1B:
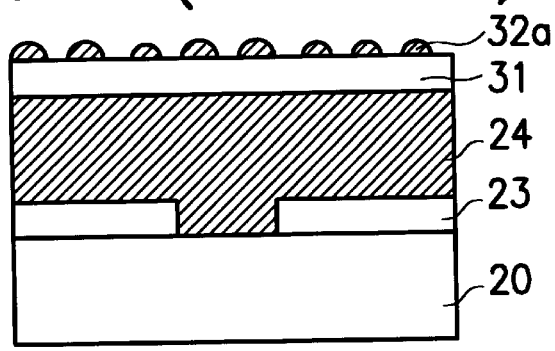
Figure 1C:
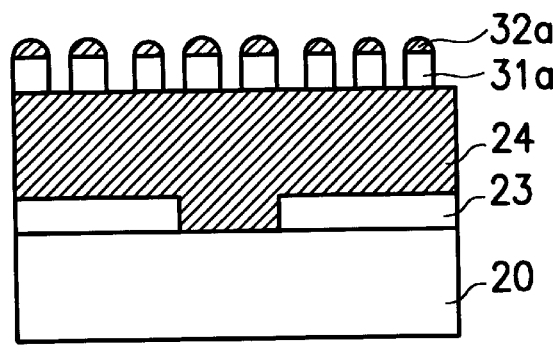
Figure 1D:
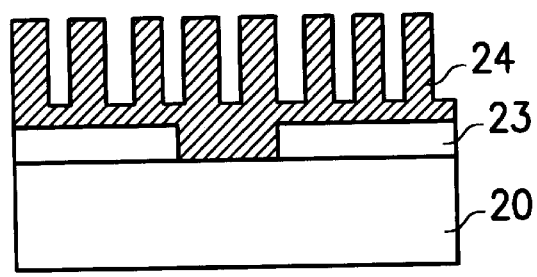
Figure 2A:
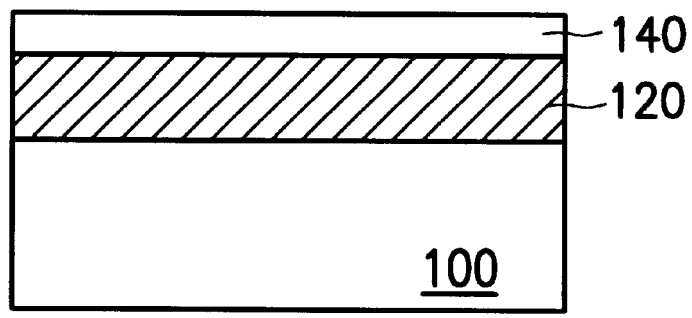
FIGS. 2A through 2E are schematic diagrams illustrating the steps for fabricating a capacitor electrode according to a first embodiment of the invention.

Referring to FIG. 2A, a conducting layer 120 and a photoresist layer 140 are successively formed over a substrate 100. The substrate 100 is a semiconductor substrate such as a silicon, germanium, or gallium-arsenide substrate. The substrate 100 can further be an epitaxial or a silicon on an insulator substrate. In the embodiment, a p-type silicon substrate is taken for example.

The conducting layer 120 can be a polysilicon layer which is formed by, for example, reacting $SiH_4$ in a low-pressure chemical vapor deposition (LPCVD) process. The conducting layer 120 can have a thickness of about 500–2000 Å. The conductivity of the conducting layer 120 can be improved by diffusing or implanting ions in the polysilicon or by an in-situ doped method.

Figure 2B:
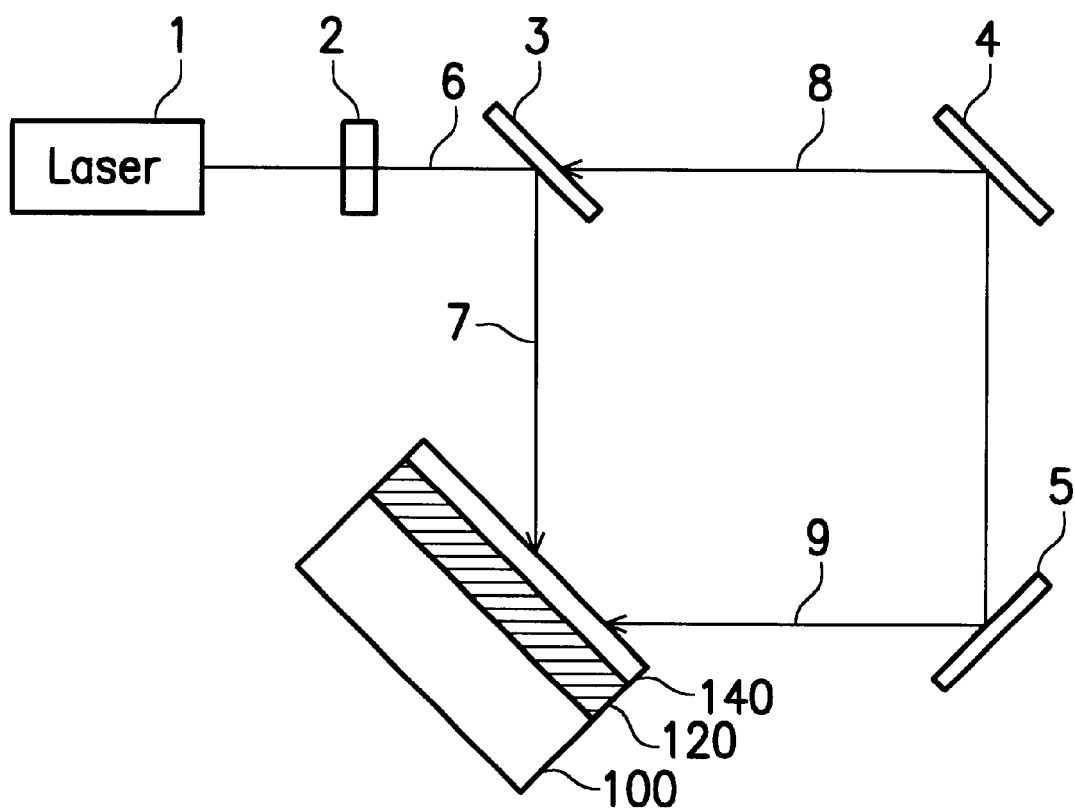
Figure 2C:
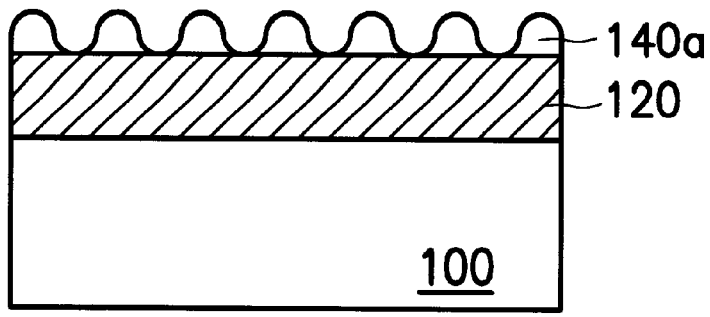
Figure 2D:
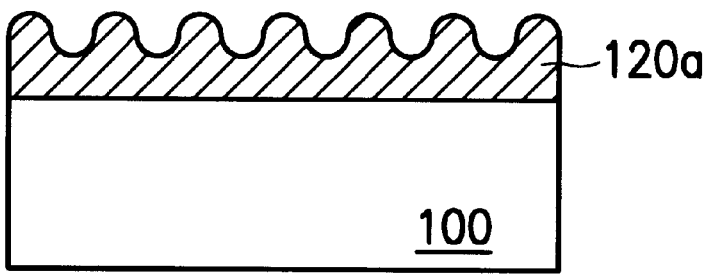
Figure 2E:
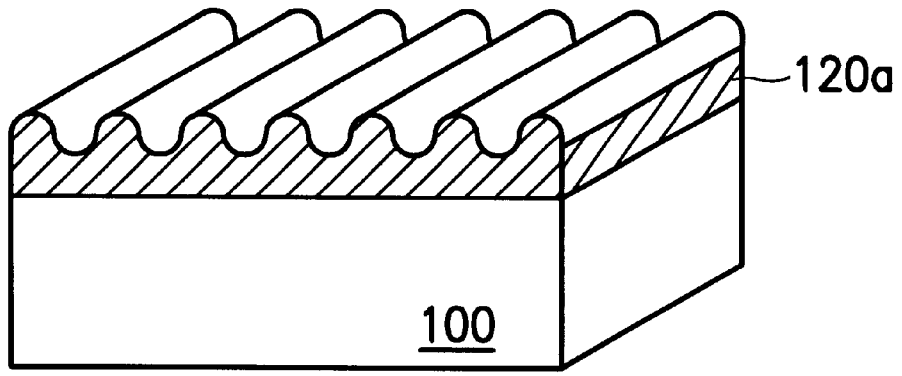

Referring to FIG. 2B, a single exposure step is applied to the photoresist layer 140. The exposure step can utilize holography technology requiring a light source 1, such as a deep ultraviolet (DUV) source, a KrF laser source, or an X-ray source. The light from the light source 1 is transformed to a plane wave 6 by a transform device 2, such as a filter. The plane wave 6 is then separated into a first wave 7 and a second wave 8 by a beam splitter 3. The first wave 7 is a main wave. The second wave 8 travels through lens 4 and 5 and becomes a reference wave 9. The wave form of the reference wave 9 can be modified to be a spherical or irregular form by rearranging the lens 4 and 5. The photoresist layer 140 is then exposed under the main wave 7 and reference wave 9 which interfere at a predetermined orientation.

Referring to 2C, the photoresist layer 140a which has sine-wave shape is developed from the exposed photoresist layer 140. Further referring to FIGS. 2D and 2E, using the photoresist layer 140a as a mask, a conducting layer 120a also having the sine-wave shape is formed by, for example, dry etching the conducting layer 120 of FIG. 2C.

Figure 3A:
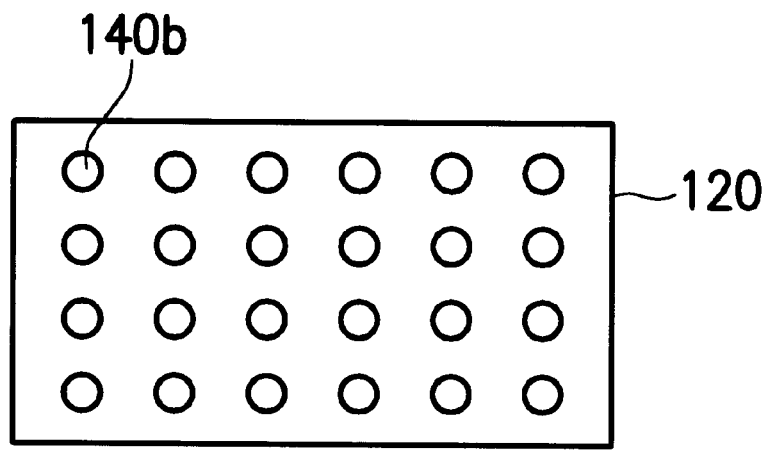
FIG. 3A is a schematic diagram of a patterned photoresist as a mask.
Figure 3B:
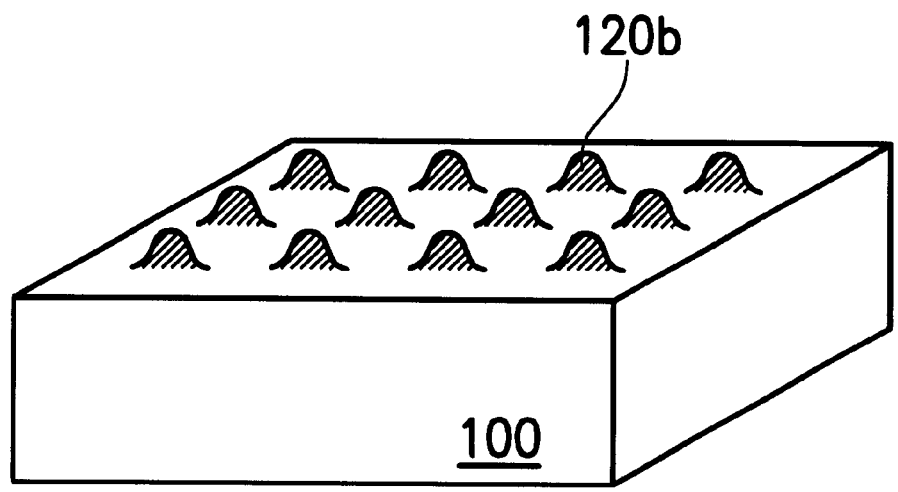
FIG. 3B is a schematic diagram illustrating a hump surface patterned by the mask of FIG. 3A.

As illustrated in FIGS. 3A through 3B, a second embodiment of the invention utilizes either two exposure steps of two interfering light beams or a single exposure step of four interfering light beams to form a hump shape surface.

In the embodiment, the structure of FIG. 2A which includes a conducting layer 120 and a photoresist layer 140 over a substrate 100 is utilized. A light interfering exposure step is applied to the photoresist layer 140 to form a hump shape surface (140b). Referring to FIG. 3A, the photoresist layer after the light interfering exposure step has the hump shape surface (140b). The light interfering exposure step is carried out by separating the light source 1 of FIG. 2B into two light beams 7 and 9 which have a first interfere over the photoresist layer and a second interfere after rotating the substrate to an angle of 90°. The hump shape surface of FIG. 3A can also be formed by directly separating the light 1 into four beams and interfering them over the photoresist layer.

Further referring to FIG. 3B, using the photoresist layer of FIG. 3A as a mask, a hump shape conducting layer 120b can be formed by etching the conducting layer 120.

As illustrated in FIGS. 4a through 4F, another embodiment of the invention includes etching the conducting layer of FIG. 3B to a predetermined thickness, thereby forming an electrode with a plurality of pillars.

Figure 4A:
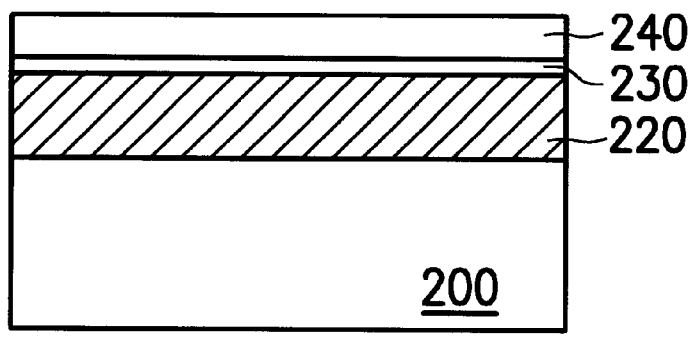
FIGS. 4A through 4F are schematic diagrams illustrating the steps for fabricating a capacitor electrode according to another embodiment of the invention.

Referring to FIG. 4A, a conducting layer 220, an insulating layer 230 and a photoresist layer 240 are successively formed over a substrate 200. The substrate 200 can be a p-type silicon substrate. The conducting layer 220 can be a polysilicon layer. The insulating layer 230 can be an oxide layer or a nitride layer.

Figure 4B:
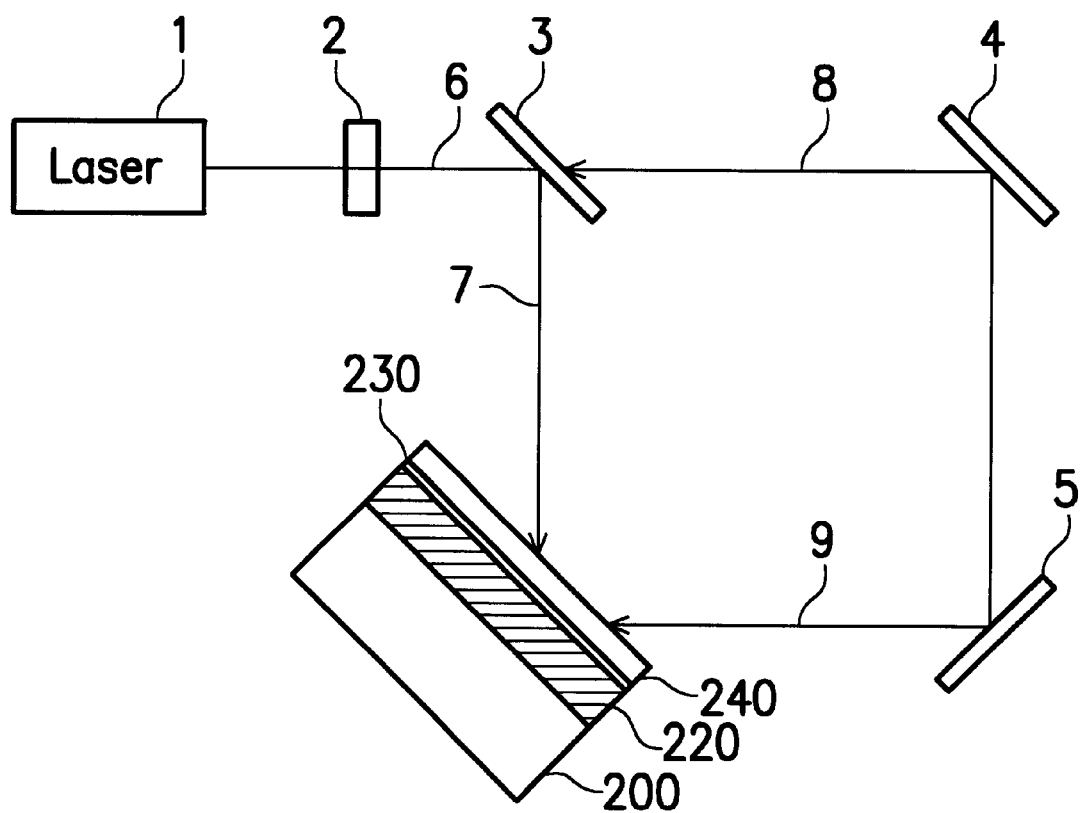

Referring to FIG. 4B, a double exposure step is applied to the photoresist layer 240. The exposure step can utilize holography technology requiring a light source 1, such as a deep ultraviolet (DUV) source, a KrF laser source, or an X-ray source. The light from the light source 1 is transformed to a plane wave 6 by a transform device 2, such as a filter. The plane wave 6 is then separated into a first wave 7 and a second wave 8 by a beam splitter 3. The first wave 7 is a main wave. The second wave 8 travels through lens 4 and 5 and becomes a reference wave 9. The wave form of the reference wave 9 can be modified to be a spherical or irregular form by rearranging the lens 4 and 5.

Figure 4C:
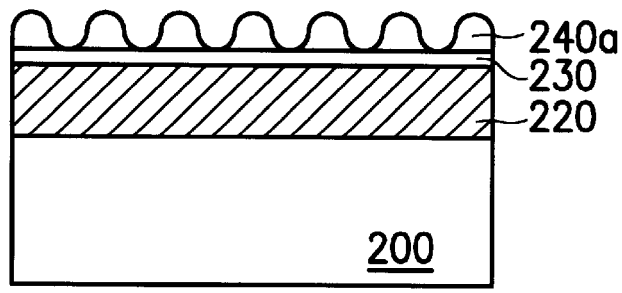
Figure 4D:
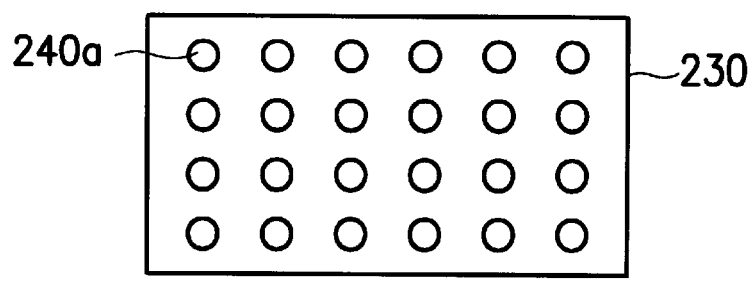

In a first interfering exposure step, the photoresist layer 240 is exposed under the main wave 7 and reference wave 9 which interfere at a predetermined orientation. The substrate 200 is then rotated to about an angle of 90° for a second interfering exposure step which is similar to the first one. Referring to FIGS. 4C and 4D, a hump shape surface is formed by developing the exposed photoresist layer 240.

Figure 4E:
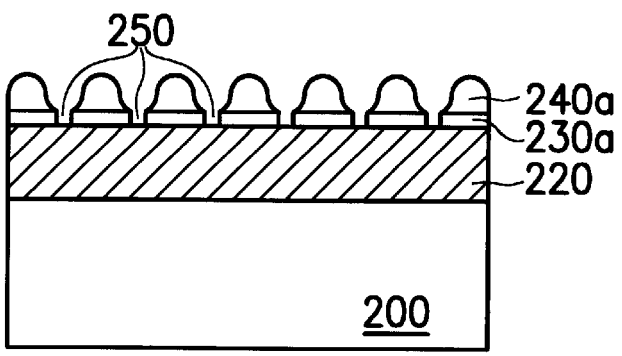

Further referring to FIG. 4E, using the photoresist layer 240a as a mask, the insulating layer 230 is anisotropically etched to form a plurality of openings 250, thereby exposing a portion of the conducting layer 220. The insulating layer 230 can be etched by the reactive ion etch (RIE) method in which $CHF_3$ plasma is utilized.

Figure 4F:
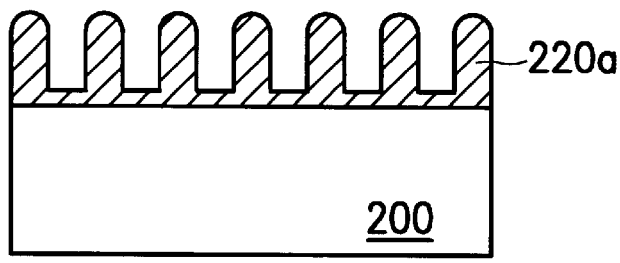

Referring to FIG. 4F, using the insulating layer 230a as a mask, the conducting layer 220 is etched to a predetermined thickness. Removing the photoresist layer 240a and the insulating layer 230a, the remaining conducting layer 220a becomes an electrode with a hump shape surface. The conducting layer 220 can be etched to a thickness of about 1500 Å, by the RIE method which utilizes $Cl_2$, HCl or $SiCl_2$ as reacting gas. Moreover, since the pillars of the conducting layer have sharp corners which will gather a lot of charges, a wet etching step can be carried out to smoothen the conducting layer surface. The mixture of $HNO_3$ and HCF solution can be utilized to perform the wet etching step.

As illustrated in FIGS. 5A through 5E, another embodiment of the invention utilizes different characteristics of a positive and negative photoresist for forming a plurality of holes.

Figure 5A:
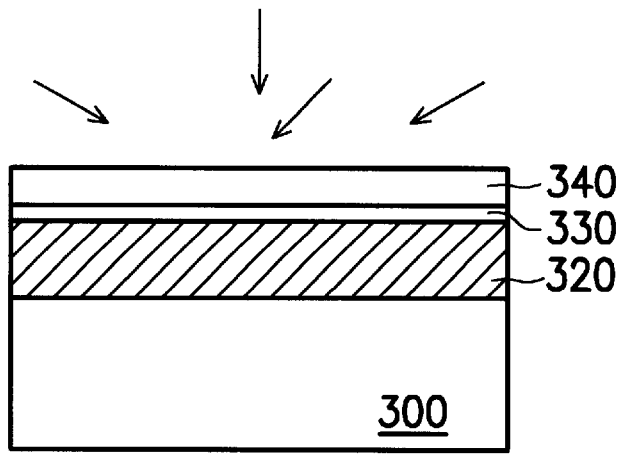
FIGS. 5A through 5E are schematic diagrams illustrating the steps for fabricating a capacitor electrode according to another embodiment of the invention.

Referring to FIG. 5A, a conducting layer 320 and an insulating layer 330 are successively formed over a substrate 300. A positive or negative photoresist layer 340 is then formed over the insulating layer 330.

Figure 5B:
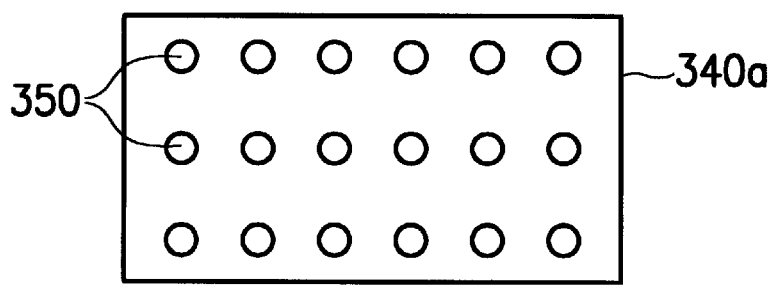
Figure 5C:
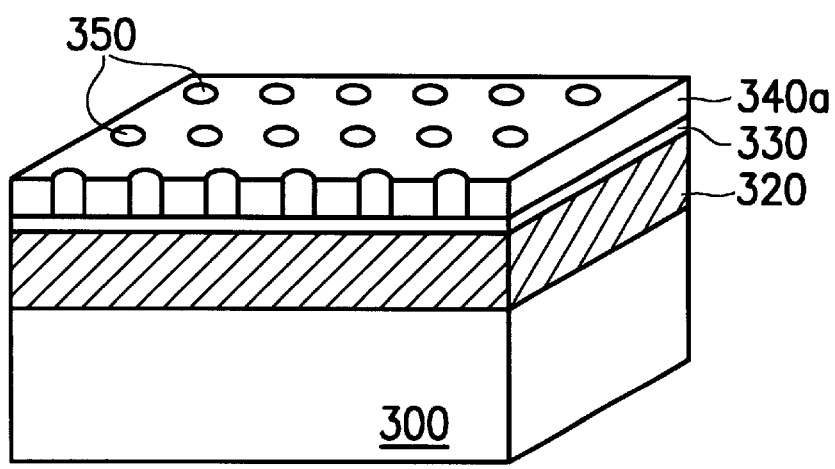

Referring to FIGS. 6A and 6B, in accompaniment with FIGS. 5B and 5C, the photoresist layer 340 is developed to have a plurality of holes 350.

The photoresist layer of the invention can be positive or negative. For example, referring to FIG. 6A, four light beams interfere to constitute an orthogonal pattern in which regions 1 (white regions), regions 0 (gray regions) and regions 1/2 represent exposed, unexposed and lightly exposed regions, respectively. The regions 0 are overlapping regions of vertical lines 600a and horizontal lines 600b. The regions 1/2 are exposed to only one of lines 600a and lines 600b. The regions 1 are free from the lines 600a and 600b. Since a positive photoresist develops its exposed regions, such as regions 1 of FIG. 6B, the positive photoresist layer is under-exposed to form a plurality of holes in regions 1. On the contrary, since a negative photoresist develops its unexposed regions, such as regions 0 of FIG. 6B, the negative photoresist layer is over-exposed to form a plurality of holes in regions 0.

Figure 5D:
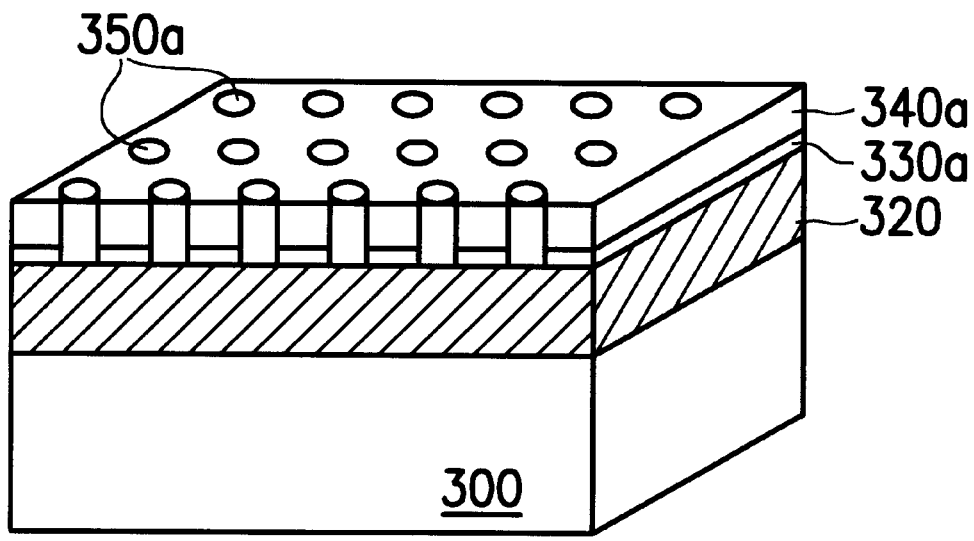

Referring to FIG. 5D, using the remaining photoresist layer 340a as a mask, the insulating layer 330 is anisotropically etched to form a plurality of holes 350a in which the surface of the conducting layer 320 is exposed. The insulating layer 330 can be etched by the RIE method which utilizes $CHF_3$ as reactor.

Figure 5E:
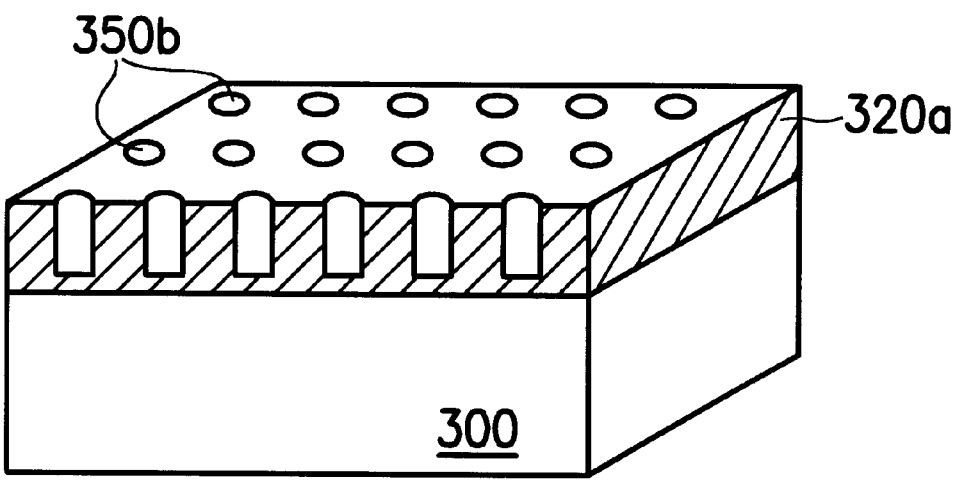

Further referring to FIG. 5E, using the etched insulating layer 330a as a mask, the conducting layer 320 is etched to a predetermined thickness. The photoresist layer 340a and insulating layer 330a are then removed to leave the conducting layer 320a as an electrode which includes a plurality of holes 350b. The conducting layer 320, if consisting of polysilicon, can be etched to a thickness of about 1500 Å by the RIE method utilizing C12, HCl or SiCl2 as reacting gas.

Figure 7:
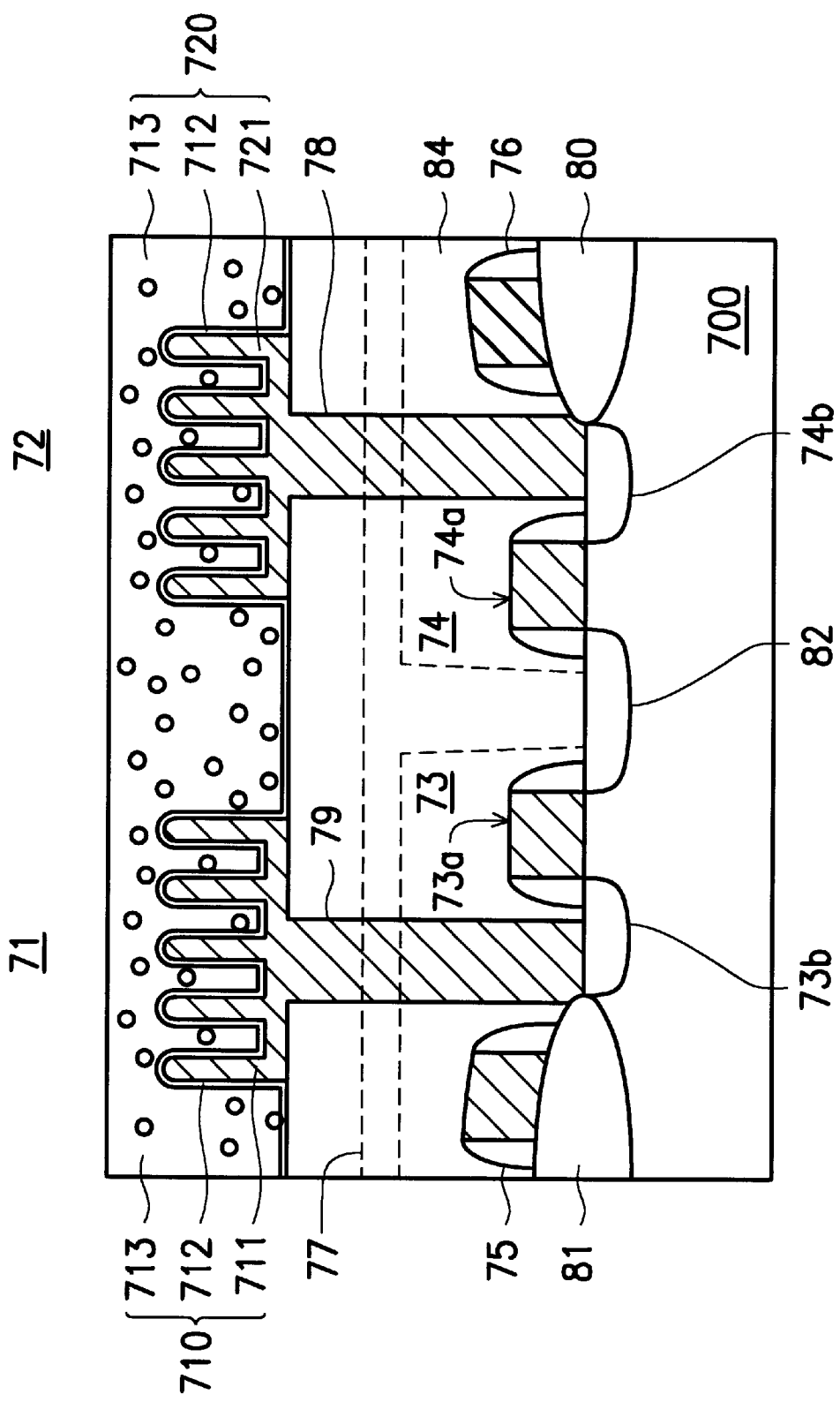
FIG. 7 is a cross-sectional view of a memory cell in which the capacitor is fabricated by the method of the invention.

Referring to FIG. 7, the method for fabricating a memory cell 71, 72 by forming a dielectric layer 712 and an upper electrode 713 over a lower electrode 711 will be described. The lower electrode 711 can be the conducting layer of FIG. 4F. The method is applied to a p-type silicon substrate 700 on which transistors 73 and 74 have been formed. For example, a thermal oxidation step such as LOCOS is carried out to form field oxide layers 80 and 81, thereby defining an active area. The field oxide layers 80 and 81 have a thickness of about 5000 Å. Moreover, semiconductor processes such as deposition, photolithography and ion implantation can be carried out to form the transistors 73 and 74 and word lines 75 and 76. The transistors 73 and 74 include gates 73a and 74a, source diffusion regions 73b and 74b and drain diffusion region 82. The gates 73a and 74a can be polysilicon gates.

Referring to FIG. 7, an insulating layer 84 is then formed over the transistors 73 and 74 and the substrate 700. The insulating layer 84 can be a BPSG layer formed by the atmospheric pressure chemical vapor deposition (APCVD) method which utilizes TEOS, $O_3/O_2$, TEB or TMP as reactors. The insulating layer 84 is then patterned to form source/drain windows. Moreover, a conducting layer is formed and patterned over the insulating layer 84, thereby forming a bit line 77 over drain diffusion region and plugs 78 and 79 over source diffusion regions 73b and 74b.

The aforementioned interfering exposure steps are then carried out to form a lower electrodes 711 and 712. For example, a sine-wave surface can be formed by interfering two light beams, whereas a hump shape surface and a plurality of holes can be formed by interfering four light beams. Moreover, a plurality of holes can also be formed in the electrode by properly over- or under-exposing a positive or negative photoresist layer. The electrode is then defined to a capacitor region by photolithography. This photolithography step can also be carried out before the electrode is patterned.

Furthermore, a dielectric layer 712 such as an oxide/nitride/oxide (ONO) layer or $Ta_2O_5$ layer which has a high dielectric constant is formed. The dielectric layer 712 is then covered by another conducting layer 713. The conducting layer 713 can be a polysilicon layer formed by the LPCVD method which utilizes, for example, SiH4 as reactor. The conductivity of the polysilicon layer 713 can be improved by diffusing or implanting ions therein. The polysilicon layer 713 can also be an in-situ doped polysilicon layer. A capacitor 710 and 720 including lower electrodes 711 and 721, dielectric layer 712 and upper electrode 713 is therefore formed. The figure thus illustrates a memory cell including the capacitor 710 and 720, the bit line 77 and the transistors 73 and 74.

Since the capacitor structure of the invention has a large electrode area, and the holography technology utilized is quite simple, the method of the invention can satisfy the requirements of high density DRAM production. Moreover, the method of the invention is not limited to the materials and dimensions disclosed in the aforementioned embodiments.

What is claimed is:

1. A method for fabricating a capacitor electrode on a semiconductor substrate on which a transistor having a diffusion region is formed, comprising the steps of:

forming a first insulating layer over the semiconductor substrate;

patterning the first insulating layer to expose a portion of the diffusion region as a window;

forming a first conducting layer over the semiconductor substrate and filling in the window;

forming a second insulating layer over the first conducting layer;

forming a photoresist layer over the second insulating layer;

patterning the photoresist layer through an interfering exposure step using a holography technology;

etching anisotropically the second insulating layer using the patterned photoresist layer as a mask, thereby forming a plurality of openings in which the first conducting layer is exposed;

etching anisotropically the first conducting layer using the second insulating layer as a mask;

removing the photoresist layer and the second insulating layer, thereby leaving the first conducting layer as a lower capacitor electrode;

forming a dielectric layer over the lower capacitor electrode; and forming a second conducting layer over the dielectric layer as an upper capacitor electrode.

2. The method as claimed in claim 1, further including a photolithography step before forming the second insulating layer for defining the lower capacitor electrode.

3. The method as claimed in claim 1, wherein the photoresist layer is a positive photoresist layer.

4. The method as claimed in claim 1, wherein the photoresist layer is a negative photoresist layer.

5. The method as claimed in claim 1, wherein the holography technology includes the steps of:

providing a light source;

transforming the light source to a plane wave;

separating the plane wave into a main wave and a reference wave; and directing the main wave and the reference wave to the photoresist layer surface over which the main wave and the reference wave interfere with each other.

6. The method as claimed in claim 5, wherein the main wave and the reference wave are plane waves.

7. The method as claimed in claim 5, wherein the main wave is a plane wave, and the reference wave is a spherical wave.

8. The method as claimed in claim 5, wherein the light source is selected from the group consisting of laser source, deep ultraviolet (DUV) source, and X-ray source.

9. The method as claimed in claim 1, wherein the holography technology includes the steps of:

providing a light source;

transforming the light source to a plane wave;

separating the plane wave into four beams; and directing the four beams to the photoresist layer surface over which the four beams interfere with each other.

10. The method as claimed in claim 1, wherein the interfering exposure step includes a double exposure step.

11. The method as claimed in claim 10, wherein the holography technology includes the steps of:

providing a light source;

transforming the light source to a plane wave;

separating the plane wave into a main wave and a reference wave;

directing the main wave and the reference wave to the photoresist layer surface over which a first interfering exposure occurs; and rotating the semiconductor substrate to about an angle of 90°, thereby introducing a second interfering exposure over the photoresist layer surface with the main wave and the reference wave interfere thereon.

12. The method as claimed in claim 1, wherein a plurality of humps are formed in the patterning of the photoresist layer.

13. The method as claimed in claim 1, wherein a plurality of holes are formed in the patterning of the photoresist layer.

* * * * *